United States Patent [19]

Georges et al.

[11] Patent Number: 5,765,099

[45] Date of Patent: Jun. 9, 1998

[54] DISTRIBUTION OF RADIO-FREQUENCY SIGNALS THROUGH LOW BANDWIDTH INFRASTRUCTURES

[76] Inventors: John B. Georges, 2117 Rose St., Apt. #5, Berkeley, Calif. 94705; David M. Cutrer, 2985 Santos Lane #105, Walnut Creek, Calif. 94596; Kam Y. Lau, 3499 Shadow Creek Dr., Danville, Calif. 94506

[21] Appl. No.: 871,556

[22] Filed: Jun. 10, 1997

Related U.S. Application Data

[63] Continuation of Ser. No. 635,368, Apr. 19, 1996, abandoned.

[51] Int. Cl.[6] ............................ H04B 1/26; H04B 3/58
[52] U.S. Cl. .................. 455/14; 455/22; 455/209; 455/316; 455/318
[58] Field of Search ........................ 455/14, 20, 22, 455/63, 66, 208, 209, 316, 317, 318, 319, 11.1, 12.1

[56] References Cited

U.S. PATENT DOCUMENTS

| | | | |
|---|---|---|---|
| 2,671,850 | 3/1954 | Marcou | 455/22 |
| 2,747,083 | 5/1956 | Guanella | 455/22 |
| 4,063,173 | 12/1977 | Nelson et al. | 455/20 |
| 4,186,347 | 1/1980 | Brockman et al. | 455/316 |
| 4,417,279 | 11/1983 | Shinkawa et al. | 455/208 |
| 4,449,246 | 5/1984 | Seiler et al. | 455/20 |
| 4,476,574 | 10/1984 | Struven | 455/14 |
| 4,500,976 | 2/1985 | DuBroff | 455/209 |
| 4,556,988 | 12/1985 | Yoshisato | 455/208 |
| 4,856,085 | 8/1989 | Horvat | 455/209 |
| 4,901,368 | 2/1990 | Arnold et al. | 455/12.1 |
| 4,959,862 | 9/1990 | Davidov et al. | 455/6.1 |
| 5,046,135 | 9/1991 | Hatcher | 455/316 |
| 5,109,532 | 4/1992 | Petrovic et al. | 455/63 |
| 5,361,407 | 11/1994 | Sawada et al. | 455/209 |
| 5,404,570 | 4/1995 | Charas et al. | 455/22 |
| 5,428,836 | 6/1995 | Sanecki et al. | 455/209 |
| 5,603,080 | 2/1997 | Kallander et al. | 455/14 |

FOREIGN PATENT DOCUMENTS 9413067  6/1994  WIPO ................ H04B 5/00

Primary Examiner—Nguyen Vo
Assistant Examiner—Sam Bhattacharya
Attorney, Agent, or Firm—Lumen Intellectual Property Services

[57] ABSTRACT

A system and method for transmitting a radio frequency (RF) signal in a RF bandwidth over a low bandwidth medium, e.g., in-building cabling, which has a transmission bandwidth below the RF bandwidth. The system has a unit for receiving the RF signal and a global reference oscillator for distributing a global reference tone of high stability to the entire system. Local oscillators are controlled by adjustment signals derived from this global reference tone to deliver RF reference tones of high stability required for mixing the RF signal to obtain an intermediate frequency (IF) signal which is fed through the low bandwidth medium. The global reference tone is preferably delivered through the same low bandwidth medium to desired locations, such as remote coverage sites in a network for cellular communications, cordless telephony, local RF communications, interactive multi-media video, high bit-rate local communications.

30 Claims, 8 Drawing Sheets

DISTRIBUTION OF RADIO-FREQUENCY SIGNALS THROUGH LOW BANDWIDTH INFRASTRUCTURES

This application is a continuation of application Ser. No. 08/635,638, filed Apr. 19, 1996, now abandoned.

BACKGROUND—FIELD OF THE INVENTION

The present invention relates to the field of radio-frequency (RF) signal distribution, and in particular to an apparatus and method for distributing RF signals through low bandwidth infrastructures.

BACKGROUND—DESCRIPTION OF PRIOR ART

The demand for wireless communications continues to grow rapidly. The need for efficient and low-cost systems for distributing radio frequency (RF) signals is a direct consequence of this growth. Distribution of RF signals is particularly difficult in areas with many natural and man-made obstacles which scatter or absorb RF radiation. For example, the problem of RF distribution is especially acute inside and around building structures.

Current in-building distribution systems consist of two major parts. The first is a set of antennas and associated accessories required for re-transmitting the RF signals inside buildings. The second is a cabling system, e.g., an optical fiber network, used for interconnecting the in-building antennas with a main antenna. The latter is usually installed on top of the building or at some location where the external RF signals can be easily received. In cases where the RF signals are supplied via a high transmission bandwidth cable the main antenna can be replaced by a direct interface with the RF network, e.g., in the basement.

The cost of installing and maintaining such in-building distribution networks is very high. One of the major cost factors is the cabling network. In addition, running new cables between various rooms, floors, or wings of a building is usually time-consuming and disruptive. For this reason, desirable solutions to in-building RF distribution systems should incur minimal installation cost, require no special tooling (as necessitated, e.g., in fiber optic networks), and produce no undue disturbance in the building during installation and operation. It would also be advantageous for such networks to be consistent with common in-building cable infrastructure.

The most effective manner of satisfying these criteria would be to use an existing or standard in-building cable infrastructure. Unfortunately, several obstacles prevent this approach. The major problem is related to the frequency bands used for transmitting RF information signals. Cellular communications presently utilize a carrier frequency around 1 GHz. For, example, the Advanced Mobile Phone System (AMPS) protocol uses the bandwidth from 824–894 MHz and GSM is transmitted between 890–960 MHz. Recent legislation has allowed PCS services to move to even higher frequencies (e.g., 1.85–1.99 GHz). In comparison, the standard in-building cabling such as unshielded or shielded twisted pair (UTP and STP) used for local area networks (LAN), telephone cables, multi-mode optical fiber links, and power lines are limited to much lower transmission bandwidths. For example, category 5 (10 base T) UTP cable has signal loss and cross talk properties that limit the bandwidth to approximately 0–100 MHz for distances <100 m. Although these parameters suffice for LAN applications, they are clearly inadequate for the delivery of cellular and PCS signals to and from remote antenna sites.

For this reason, prior art solutions employ wide bandwidth media such as coaxial cables and optical fibers. These media have to be installed separately, and require specially trained personnel, as discussed above.

Thus, the challenge is to transmit high frequency RF signals over the standard low bandwidth infrastructures discussed above. The common method of accomplishing this goal is to initially down-convert the band of the RF signal to an intermediate frequency (IF) which is within the bandwidth of the cable. Then, the IF signal is fed through the standard low bandwidth cable found in the building. At the remote antenna site the IF signal is up-converted to recover the original RF signal and the recovered RF signal is re-transmitted by the remote antenna. This solution is illustrated in FIG. 1 and will be discussed in the detailed description.

A major problem encountered in implementing this solution involves the stability of local oscillators. These provide the reference signals required by the mixers to down-convert and up-convert the signals. To ensure proper operation the local oscillators must generate a stable tone at the selected high RF frequency (e.g., 800 MHz). It is critical that the frequency of the two oscillators be matched to within at least the channel spacing of the RF signals. In fact, it is desirable that the oscillators be "locked" to each other to preserve the frequency of the RF signal band. This issue becomes even more crucial at higher frequencies, e.g., the PCS bandwidth centered around 2 GHz where the relative width of the communication channels is small in comparison to the carrier frequency.

The two solutions to this problem are to either use very stable oscillators (e.g., <1 part per million stability), which are prohibitively expensive, or to distribute the oscillator tone from a central location. The second option is not viable either, since the media under consideration do not have the bandwidth required for the implementation of such a system.

The existing solutions to distributing a stable oscillator tone are limited. In U.S. Pat. No. 5,046,135 Hatcher shows how to eliminate frequency instabilities in a receiver frequency converter due to inherent local oscillator instability by adding a marker signal at the down-conversion stage. The marker signal is distorted in the same manner as the IF signal and a second stage down-converter computes this distortion by comparison with the marker signal before undertaking any further down-conversion.

This solution is complicated, since it breaks down the conversion process into two steps and requires the addition of a marker tone in addition to the oscillator frequencies and the signal. Moreover, it can not be employed in conjunction with the low bandwidth media found in buildings. Indeed, the main purpose of the invention is to gradually and reliably down-convert very high-frequency signal received, e.g., from satellites in orbit.

U.S. Pat. No. 4,959,862 issued to Davidov et al. addresses a novel scheme for the delivery of FM modulated subcarriers over a fiber-optic link for cable television transmission (CATV). Conventional CATV systems use vestigal sideband amplitude modulation (VSB-AM) for transmission of analog video channels to home users. In comparison, frequency division multiplexed frequency modulated (FDM-FM) signals can provide a higher signal to noise ratio and a longer transmission distance. Davidov et al. describe a method for the conversion of VSB-AM channels to FDM-FM channels before transmission over the fiber-optic link. After transmission, the FM signals are re-converted back to AM signals before transmission to the home. A 4 MHz "global reference" is distributed along with the FM signals to AM signals.

Although Davidov et al. address the idea of a global signal which can be used for reference ("locking") of conversion stages, this idea is not applicable to the problem at hand. First, the reference signal is high frequency and is distributed to the remote antenna sites for the purpose of FM to AM signal conversion. It is not a signal which is compatible with a system based on a limited and low bandwidth medium for transmitting RF signals. In fact, Davidov et al. emphasize the fact that this system uses a fiber-optic medium which is broadband. Moreover, in Davidov's system architecture it is not necessary to use the global reference, rather it is provided for convenience. The only advantage Davidov et al. derive from using a centralized oscillator is the reduction of oscillator phase noise.

In U.S. Pat. No. 5,109,532 Petrovic et al. discuss the transmitter and receiver of a radio communication link. This link requires up- and down-conversion of the signals to be transmitted to and from the radio band of interest. The frequency and phase of the oscillators used for up- and down-conversion are a large cost and performance consideration. The problem is solved by adding a radio frequency pilot tone to the up-converted signals before transmission. At the receiver, a local oscillator is used to down-convert both the RF signal and the pilot tone. Any phase or frequency deviations of the local oscillator affect the RF signal and the pilot tone equally. Therefore, both signals can be used to cancel the phase and frequency variations, resulting in a clean recovered signal as shown in FIG. 2C in Petrovic's patent. This cancellation method solves the problem of local oscillator stability at the receiver.

Although the disclosure is intended to solve a similar problem as the present invention, namely the stability of a remote oscillator, the method by which the problem is solved is quite different. Furthermore, the method does not describe, nor is it obvious, how one would implement this technique over a low-bandwidth medium, since the pilot tone is at a RF frequency.

In addition to devising a system for proper "locking" of oscillators to be able to transmit RF signals through low bandwidth infrastructure there are additional unsolved problems. In a typical RF distribution system multiple remote antennas re-transmit the up-converted RF signal. To ensure complete coverage the coverage areas of the individual antennas overlap. Thus, a user will frequently receive signals from multiple antennas simultaneously. When the individual oscillators used for the up-conversion at those antennas are not exactly frequency matched the user will hear a baseband tone or beat at the difference between the frequencies of the two local oscillators.

Thus, efficient and reliable distribution of RF signals over low bandwidth infrastructures remains an unsolved problem.

OBJECTS AND ADVANTAGES OF THE INVENTION

In view of the shortcomings of prior art, it is an object of the invention to provide a system and method for distributing RF signals through low bandwidth infrastructure. In particular, it is an object of the invention to enable one to distribute RF signals through standard in-building cabling.

Another object of the invention is to ensure that the system is highly efficient in its use of resources, simple to install and operate, and low-cost.

Yet another object of the invention to provide a method and a system for distributing RF signals in buildings which avoid oscillator instabilities which generate beat frequencies and related effects and lead to decreased link quality.

These and other objects and advantages will become more apparent after consideration of the ensuing description and the accompanying drawings.

SUMMARY OF THE INVENTION

The objects of the invention are achieved by a unique system for transmitting a radio frequency (RF) signal in a RF bandwidth over a low bandwidth medium which has a transmission bandwidth below the RF bandwidth. Typically, the low bandwidth medium is a standard cable belonging to common in-building infrastructure. The RF bandwidth is usually selected from the group of RF bandwidths used for cellular communications, cordless telephony, local RF communications, satellite television, interactive multimedia video, high bit-rate local area networks and the like. In these situations the RF bandwidth is narrower than the transmission bandwidth of the low bandwidth medium. The latter can be a 10 base T cable, a telephone wire, a fiber-optic cable, an unshielded cable, a power cable or any other low bandwidth, standard in-building infrastructure.

The system has a unit, usually a main antenna or base station, for receiving the RF signal. A global reference oscillator, preferably a very high stability oscillator such as a temperature-stabilized crystal oscillator, provides a global reference tone of high stability, e.g., <1 part per million stability, at a frequency within the transmission bandwidth of the low bandwidth medium. In the preferred embodiment the global reference oscillator is located in a safe location inside a distribution hub and the global reference tone is delivered from there to the entire system.

A first local oscillator, preferably a voltage-controlled oscillator (VCO), is controlled by a first adjustment signal derived from the global reference tone. With the aid of the first adjustment signal the first local oscillator generates a first RF reference tone of high stability. The main antenna and the first local oscillator are connected to a first mixer, such that the first RF reference tone and the RF signal are delivered to this first mixer. From these two signals the mixer generates an intermediate frequency (IF) signal, which is fed through the low bandwidth medium. The IF signal has a frequency contained within the transmission bandwidth of the low bandwidth medium.

A second local oscillator is provided at a remote location, e.g., in a remote coverage area. The second local oscillator is controlled by a second adjustment signal also derived from the global reference tone. In this manner the second local oscillator generates a second RF reference tone of high stability at the same frequency as the first RF reference tone. A second mixer is also provided at the remote location and connected to the second local oscillator and to the low bandwidth medium. Thus, the second mixer receives the second RF reference and the IF signal. By mixing these two signals the mixer recovers the original RF signal. Of course, this system can be extended to any number of remote locations, as will be necessary in a practical system which provides radio coverage to an entire building structure such as an office building or a shopping center.

The method for deriving the first and second adjustment signals relies on a phase-locking circuit or a phase-locked loop (PLL). The global reference tone can be delivered to the PLL in several ways. In particular, it can be delivered directly through a separate link, e.g., a short communication link if the global reference oscillator is positioned close to the oscillator in question. This is the case when both the local oscillator and the global reference oscillator are located in the same housing, such as a main hub. Otherwise, the global reference tone can be transmitted together with the IF signal through the low bandwidth medium.

When distributing the global reference tone through the low bandwidth medium together with the IF signal it is important that these signals do not overlap. The method of the invention stipulates that this be the case, and, in the preferred embodiment, the global reference tone has a lower frequency than the IF signal. Furthermore, a summing element is provided specifically for the purpose of adding the global reference tone to the IF signal such that both are fed through the low bandwidth medium.

A filter is used for retrieving the global reference tone from the low bandwidth medium at the remote location. This function can be performed by a simple band-pass filter with its window set for the global reference tone. The PLL in this event is located between the filter and the local oscillator at the remote location.

The phase-locking circuit itself consists of a frequency divider, also called a prescaler, connected to the local oscillator for dividing an unstable RF reference tone generated by this oscillator to derive an unstable IF reference tone near the frequency of the global reference tone. Of course, because the local oscillator is unstable, the frequencies will not be matched. A phase comparator is used to lock the unstable IF reference tone to the global reference tone by generating an output adjustment signal proportional to the mismatch between the reference and the IF signals. Preferably, another filter, also called a loop filter, is provided between the output of the phase comparator and the local oscillator. The adjustment signal stabilizes the local oscillator and induces it to generate the second RF reference tone of high stability.

The recovered RF signal can be re-transmitted at one or many remote locations, depending on the actual circumstances. Usually, local antennas with overlapping coverage areas will be used for that purpose. The low bandwidth infrastructure can be a network, e.g., a star network, a tree network, a branch network or any other type of network commonly installed inside buildings.

In the preferred manner of practicing the invention the frequency of the global reference tone is selected below the bandwidth of the IF signal. Also, the method of the invention teaches bi-directional communications as required in practical applications.

Further details and the preferred embodiment are described in the specification in reference to the attached drawing figures.

DESCRIPTION

Figure 1:
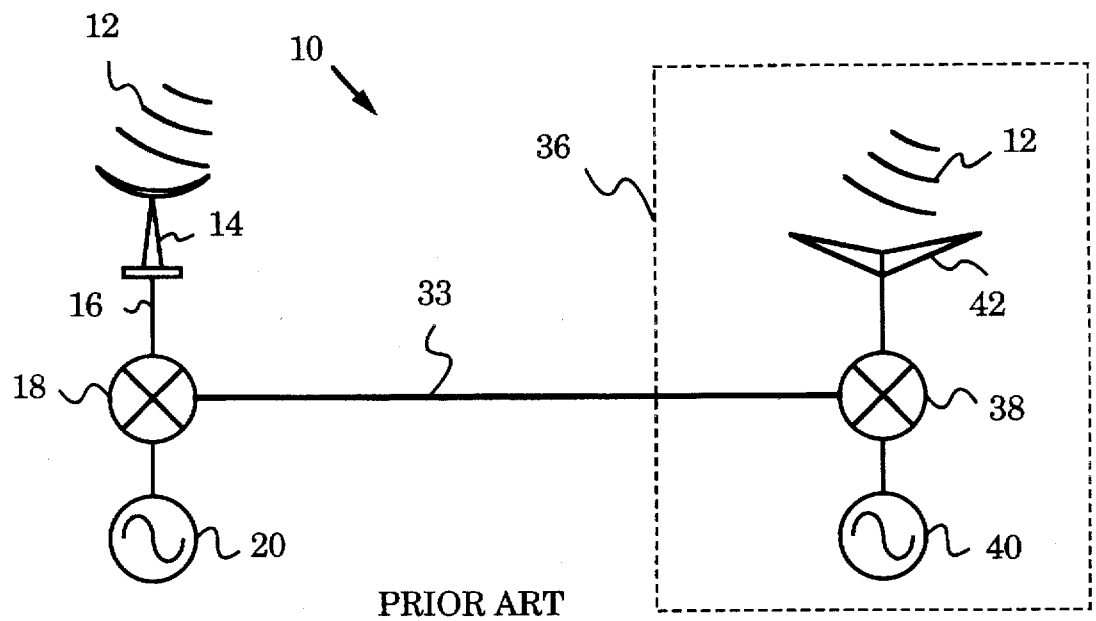
FIG. 1 is a schematic view of a typical prior art RF distribution system.
Figure 2:
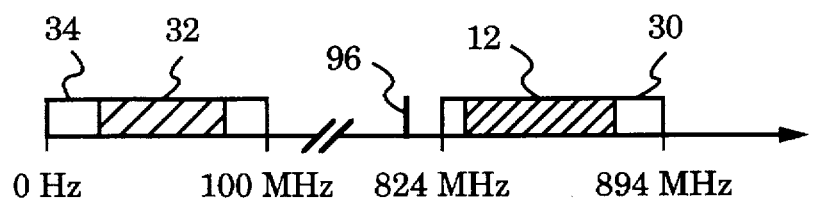
FIG. 2 is a diagram showing the typical RF bandwidth and a typical transmission bandwidth.

The salient features of the invention will be best appreciated after reviewing the typical prior art distribution system 10 for radio frequency (RF) signal 12 illustrated in FIG. 1. In this typical system RF signal 12 is in a bandwidth typically used for cellular communications or the like. FIG. 2 indicates a RF bandwidth 30, spanning the range from 824 MHz to 894 MHz. This range is typical for RF signal 12 used in cellular communications.

RF signal 12 is received by main or base antenna 14. Connection 16, e.g., a coaxial cable, delivers RF signal 12 from antenna 14 to one of the inputs of a first mixer 18. The second input of mixer 18 is connected to a first local oscillator 20. Oscillator 20 provides an RF frequency tone which is utilized by mixer 18 to down-convert RF signal 12 to an intermediate frequency (IF) and to feed it through a low bandwidth medium 33, such as a standard, pre-installed cable.

FIG. 2 better illustrates the relationships of the various signals and their bandwidths. In particular, the down-conversion of RF signal 12 from RF bandwidth 30 yields an IF signal 32 contained in a transmission bandwidth 34. Transmission bandwidth 34 ranges from 0 to 100 MHz, which is typical for low bandwidth media commonly installed in building structures.

Referring back to FIG. 1, IF signal 32 is transmitted through medium 33 to a remote location or site 36 delineated by a broken line. Site 36 is usually a room inside a building structure or some other area in which RF coverage is desired. At this location IF signal 32 is received by a second mixer 38, which, with the aid of oscillator 40, up-converts IF signal 32 to recover original RF signal 12. Then, a remote antenna 42 is used to re-transmit RF signal 12 in remote site 36.

As outlined in the background section, distribution system 10 and other related prior art systems suffer from instability of local oscillators 20 and 40 (unless very expensive oscillators are used). An RF distribution system 50 according to the invention and shown in FIG. 4 avoids this disadvantage in a simple and effective manner.

As in the prior art example, system 50 has a main or base antenna 52 which receives RF signal 12. Antenna 52 is connected by a communication link 54, e.g., a coaxial cable or any other link capable of transmitting RF signal 12 without undue distortions, to one of the inputs of a first mixer 56. The type of device selected as mixer 56 can include any suitable single ended, balanced, doublebalanced, double-double balanced or other mixer. A first local oscillator 58, preferably a voltage-controlled oscillator (VCO), is connected to another input of mixer 56. A low bandwidth medium 60, such as 10 base T cable, telephone wire, fiber-optic cable, unshielded or shielded cable, power cable, or any other low bandwidth in-building medium is connected to the output of mixer 56.

Oscillator 58 is typically a low-cost device which by itself produces an unstable RF reference tone. One output of oscillator 58 is connected to mixer 56 and another output leads to a frequency divider 62. The function of divider 62 is fulfilled by any frequency dividing device or circuit capable of dividing the received tone by an integer. The output of divider 62 is further connected to one input of a phase comparator 64. Suitable comparators are well-known in the art.

The second input of comparator 64 is connected to a global reference oscillator 66. As shown, oscillator 66 is housed in a separate housing unit or distribution hub 68. In order to ensure stability and high performance of oscillator 66 hub 68 is installed in an area not exposed to excessive temperature fluctuations, vibrations, or other external influences. These conditions are frequently met inside buildings away from windows, doors, or other openings, e.g., in basements. In addition, the preferred embodiment employs as oscillator 66 a temperature-stabilized crystal oscillator. Devices of this kind can achieve stability figures of about 1 part per million and are commercially available. The frequency of oscillator 66 will be discussed below.

It should be noted, that only one reference oscillator 66 is used in system 50. Thus, any element of system 50 in need of the tone from oscillator 66 can be supplied with it through lines 70. In this case, one of lines 70 connects oscillator 66 to the other input of comparator 64.

The output of comparator 64 is connected to a filter 72. A suitable low-pass loop filter is well-known in the art and can be constructed from commercially available components. The output of filter 72 is connected to the control input of oscillator 58.

In the preferred embodiment system 50 has a summing element or adding device 74 connecting one of lines 70 to low bandwidth medium 60. Device 74 can combine signals already traveling through medium 60 with any additional signal, in this case the signal produced by oscillator 66. Devices capable of performing this operation are well-known in the art.

At a remote coverage location or site 76 medium 60 is connected to a filter 78 and to a second mixer 80. Filter 78 has a pre-set band-pass for selecting a specific frequency from the signals transmitted through medium 60. The output of filter 78 is connected to one of the inputs of a phase comparator 82. The other input of comparator 82 is connected to the output of a frequency divider 84, analogous to frequency divider 62, which, is connected to a second local oscillator 86. As before, local oscillator 86 is a voltage-controlled oscillator which produces an unstable RF reference tone. The output of comparator 82 is hooked up through a filter 88 to the controlling input of oscillator 86.

Together, oscillator 86, divider 84, comparator 82 and filter 88 form a phase-locking device or circuit 90, frequently also called a phase-locked loop (PLL). In fact, oscillator 58, filter 72, comparator 64 and divider 62 also form a phase-locking circuit 92. Both circuits, 90 and 92, are analogous in construction and operation, as will be shown below.

Remote coverage site 76 has a re-transmitting unit 95, in this case an RF antenna for re-transmitting RF signal 12 from mixer 80. Proper positioning of antenna 95 at site 76 to ensure RF coverage will be determined by the persons installing system 50 on a case by case basis.

During operation, main antenna 52 of RF distribution system 50 receives RF signal 12. As indicated in FIG. 2, RF signal 12 is contained in RF bandwidth 30 ranging from 824 MHz to 894 MHz. In practice, however, RF signal 12 can belong to other RF bandwidths, depending on the type of communication. Thus, RF bandwidth 30 can be selected from the group of RF bandwidths used for cellular communications, cordless telephony, local RF communications, satellite television, interactive multimedia video, high bit-rate local area networks, and the like. The characteristic feature shared by all these RF bandwidths is that they are higher than transmission bandwidth 34 of medium 60.

Figure 3:
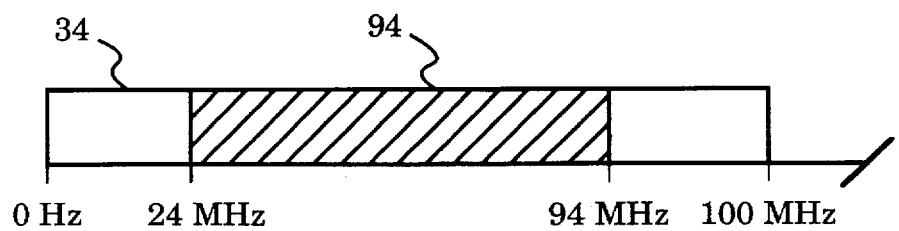
FIG. 3 is a diagram showing the transmission bandwidth and the bandwidth of the IF signal.

Antenna 52 delivers RF signal 12 via communication link 54 to first mixer 56. Meanwhile, phase-locked loop 92 delivers a first RF reference tone 96 (see FIG. 2) of high stability to mixer 56. According to known mixing techniques, first mixer 56 responds to these two inputs by generating an IF signal 94, or, in other words, down-converting RF signal 12. The result of the down-conversion—IF signal 94—is shown in FIG. 3. In the present embodiment, IF signal 94 has a narrower bandwidth (894 MHz–824 MHz=70 MHz) than transmission bandwidth 34 of medium 60. In fact, IF signal 94 only takes up the bandwidth from 24 MHz to 94 MHz. The actual bandwidth of down-converted RF signal 12, i.e., IF signal 94, can vary as conditioned by available in-building infrastructure. At any rate, since the output of first mixer 56 is connected to medium 60, IF signal 94 is transmitted or fed through medium 60.

The down-conversion process itself depends on the stability of first RF reference tone 96 supplied to first mixer 56, and the former usually depends on the stability of first local oscillator 58. In this case, however, the output of oscillator 58 is a first RF reference tone 96 of high stability. This result is achieved in several steps with the aid of the remainder of phase-locking circuit 92 and global reference oscillator 66.

Figure 5A:
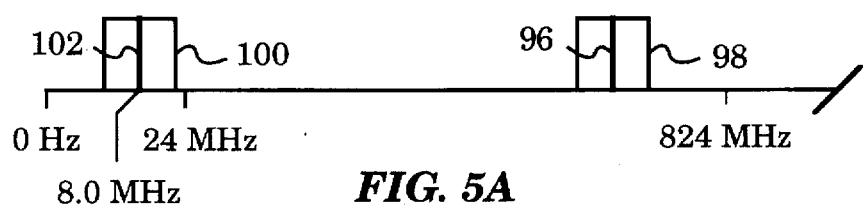
FIG. 5A is a diagram showing the stabilization of reference tones.
Figure 5B:
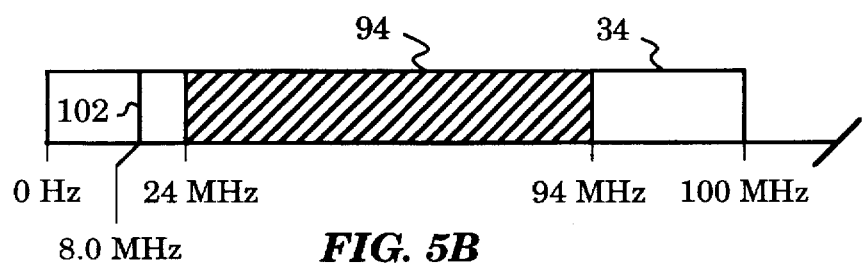
FIG. 5B is a diagram showing the relationship between the IF signal and the global reference tone.

First, as illustrated in FIG. 5A, the original output of oscillator 58 which is an unstable RF reference tone 98 is fed to frequency divider 62. The inherent fluctuation of tone 98 is evident from its wide spread of possible frequencies. Divider 62 is set to divide tone 98 by an integer to derive an unstable IF reference tone 100, as shown. It is intended that unstable IF reference tone 100 match closely the frequency of a global reference tone 102 generated by global reference oscillator 66 residing in distribution hub 68. Also, unstable IF reference tone 100 as well as global reference tone 102 are contained within transmission bandwidth 34 of medium 60.

For most reliable operation, global reference tone 102 is in the middle of the bandwidth occupied by unstable IF reference tone 100. Furthermore, it is preferable that the bandwidth of IF reference tone 100, and consequently the frequency of global reference tone 102, lie outside the bandwidth of IF signal 94. This configuration avoids any potential interference between IF signal 94 and reference tone 100. In FIG. 5A the bandwidth of IF reference tone 100 is below the bandwidth of IF signal 94 and centers around the frequency of global reference tone 102 equal to 8.0 MHz. Of course, these figures have been selected for demonstration purposes only.

Phase comparator 64 receives at its two inputs unstable IF reference tone 100 and, through line 70, the highly stable global reference tone 102. In response to these two inputs comparator 64 generates at its output a first adjustment signal 104 representative of the phase mismatch or difference between unstable tone 100 and stable tone 102. Filter 72 clears adjustment signal 104 of high frequency noise, and ensures stability of the feedback loop. From filter 72 adjustment signal 104 passes to the control input of first local oscillator 58. There, adjustment signal 104 is used to fine-tune the oscillation frequency of oscillator 58.

Thanks to the feedback nature of phase-locking circuit 92, the fine-tuning or trimming of oscillator 58 is performed continuously using the very stable global reference tone 102 as the benchmark. Consequently, the output of oscillator 58 is forced to generate first RF reference tone 96 of high stability. First mixer 56 takes advantage of this high stability reference tone 96 to produce very accurately down-converted IF signal 94, which is then fed through medium 60.

In the preferred embodiment distribution hub 68 is connected to summing element 74, which interfaces with medium 60. Thus, global reference tone 102 from oscillator 66 is delivered to summing element 74. There, IF signal 94 already traveling through medium 60 is combined with global reference tone 102 and sent through medium 60 to remote coverage site 76. No undesirable interference is created between IF signal 94 and tone 102 result, since their bandwidths do not overlap. In this manner, global reference tone 102 is efficiently forwarded to remote site 76 through the same medium as the useful signal.

At remote site 76 filter 78 retrieves global reference tone 102 from medium 60. Meanwhile, IF signal 94 passes through to second mixer 80. Phase-locking circuit 90, operating in the same manner as phase-locking circuit 92, uses tone 102 to stabilize the output of second local oscillator 86. For this purpose comparator 82 produces a second adjustment signal 106 and delivers it through filter 88 to the control input of oscillator 86. The output of oscillator 86 generates stable RF reference tone 96. Mixer 80 uses stable RF reference tone 96 to up-convert IF signal 94 and recover RF signal 12 with minimal signal distortion. Then, RF antenna 95 receives RF signal 12 and re-transmits it throughout site 76.

System 50 is thus well-adapted to RF distribution in buildings and other structures using existing low bandwidth media such as conventional cables. The system resources are basic. Only one cost-intensive oscillator, namely global reference oscillator 66, is required to ensure proper up- and down-conversion of signals in this arrangement. The other essential elements are simple, easy to install, and generally low-cost. In fact, voltage-controlled oscillators, such as oscillators 58 and 86 generating stable reference RF reference tone 96 at 800 MHz using 3.125 MHz as global reference tone 102 can achieve high stability at a very low cost.

Figure 6:
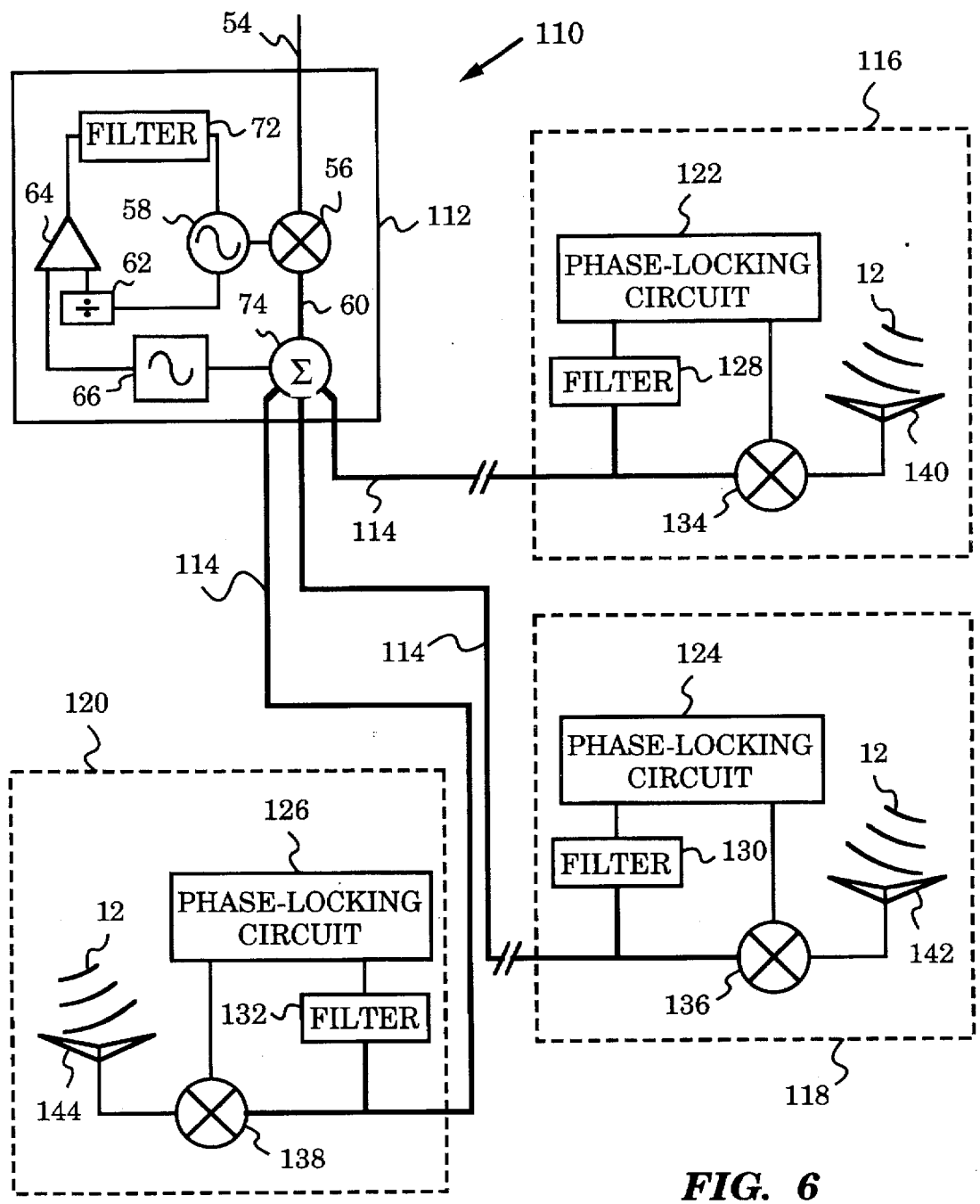
FIG. 6 is a schematic view of an RF distribution system according to the invention with multiple remote coverage sites.

The above embodiment is very simple and serves mainly to demonstrate a few fundamental aspects of the invention. A more practical RF distribution system 110 according to the invention is illustrated in FIG. 6. Corresponding parts of this embodiment are designated with the same reference numbers as in the first embodiment.

Communication link 54 delivers RF signal 12 to a main hub 112. Housed inside main hub 112 is first mixer 56 and first local oscillator 58. Divider 62, comparator 64 and filter 72 are connected and operate in the same manner as described above and are also housed in hub 112. In fact, global reference oscillator 66 and summing element 74 are inside hub 112 as well. In this manner, all elements necessary to convert RF signal 12 to IF signal 94 are arranged in the same compact unit.

Summing element 74 is connected to three low bandwidth cables 114, which are routed to their respective remote coverage sites 116, 118, 120. Phased-locking circuits 122, 124, 126 and filters 128, 130, and 132 are connected in the same manner and perform the same functions as filter 78 and circuit 90 in the previous embodiment. In other words, circuits 122, 124, 126 and filters 128, 130, and 132 allow each remote site 116, 118, 120 to filter out global reference signal 102 and use it to produce a stable second RF reference signal 96. Furthermore, each remote site 116, 118, 120 has its own second mixer 134, 136, and 138 for recovering RF signal 12 from IF signal 94. After recovery RF signal 12 is re-transmitted at each remote site 116, 118, 120 by a corresponding RF antenna 140, 142, 144.

Distribution system 110 is more compact and practical in some applications by virtue of using one single hub 112. Of course, the construction and location of hub 112 have to ensure that the internal elements are protected. Especially global reference oscillator 66 has to be isolated in a manner to ensure stability of global reference tone 102.

Figure 7:
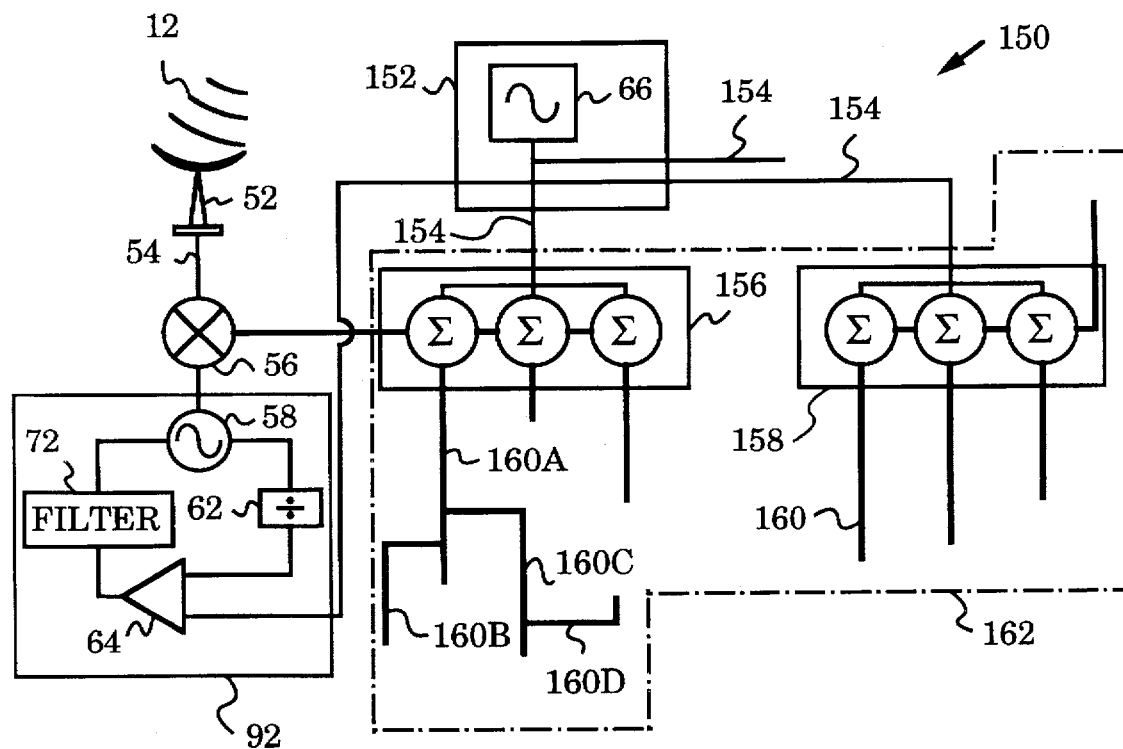
FIG. 7 is a schematic view of another RF distribution system according to the invention.

FIG. 7 illustrates another RF distribution system 150 according to the invention. As in the previous embodiments, RF signal 12, received by main antenna 52, is delivered to first mixer 56 to be down-converted to produce IF signal 94. Global reference oscillator is housed separately in a distribution hub 152. From there global reference tone 102 is distributed through links 154 to network hubs 156 and 158, and to phase-locking loop 92.

Network hubs 156 and 158 contain multiple summing elements 74 which allow one to launch global reference tone 102 on many low bandwidth cables 160. In fact, cables 160 constitute a network 162. Cables 160A–D, when viewed independently, form a tree network, while all cables 160 form two star networks with hubs 156 and 158 representing their centers.

It is clear from this embodiment that distribution system 150 of the invention can be adapted to any existing network of in-building cables. In particular, any star network, tree network, ring network or branch network is suited for distributing RF signal 12 according to the invention. In addition, links 154 do not need to be part of the network infrastructure if other media for distributing global reference signal 102 are deemed convenient by the system designer. For example, global reference tone 102 can be distributed through fiber-optic links, or AC power lines.

Figure 8:
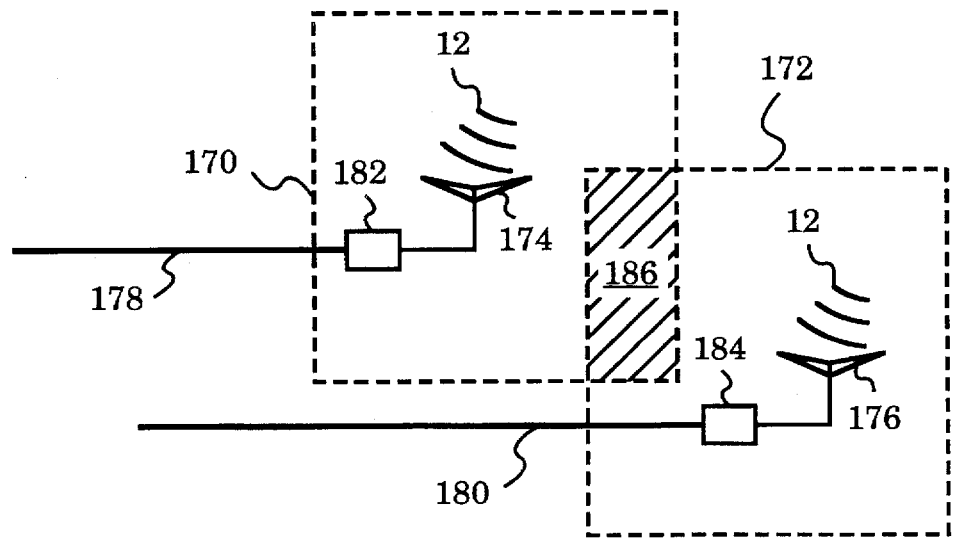
FIG. 8 is a schematic view illustrating the overlap in coverage areas.

FIG. 8 shows a particularly advantageous aspect of the invention. Two remote coverage sites 170 and 172 have corresponding RF antennas 174 and 176 for re-transmitting RF signal 12. As in the above embodiments, IF signal 94 is fed through a low bandwidth medium, in this case power cables 178 and 180. Units 182 and 184 contain all the elements discussed above necessary for recovering RF signal 12 from IF signal 94 according to the invention.

The RF coverage areas of sites 170 and 172 overlap. The region where this happens is hatched and designated by reference numeral 186. In general, overlap in coverage of adjacent sites is desirable because it guarantees complete coverage. A user equipped with an RF receiver (not shown) and positioned in region 186 will intercept RF signal 12 from both antennas 174 and 176.

In prior art systems the instability of local oscillators, even of high-quality devices, incurs a small frequency difference, $\Delta f$, between RF signal 12 coming from antenna 174 and the same RF signal 12 arriving from antenna 176. This frequency difference, (typically about ±500 Hz), creates an audible beat frequency. Besides being annoying to the user, e.g., by interfering with the conversation in the case of telephonic communications, the beat frequency can impair the functioning of the electrical components and introduce spurious signals. RF distribution systems used for data transfer can experience higher bit error rates (BER) and other degrading effects.

Fortunately, RF distribution systems according to the invention can recover RF signal 12 with no frequency shift at all. Thus, in the present case, RF signal 12 radiated from antenna 174 and from antenna 176 will have the same frequency and not induce any beats.

Figure 9:
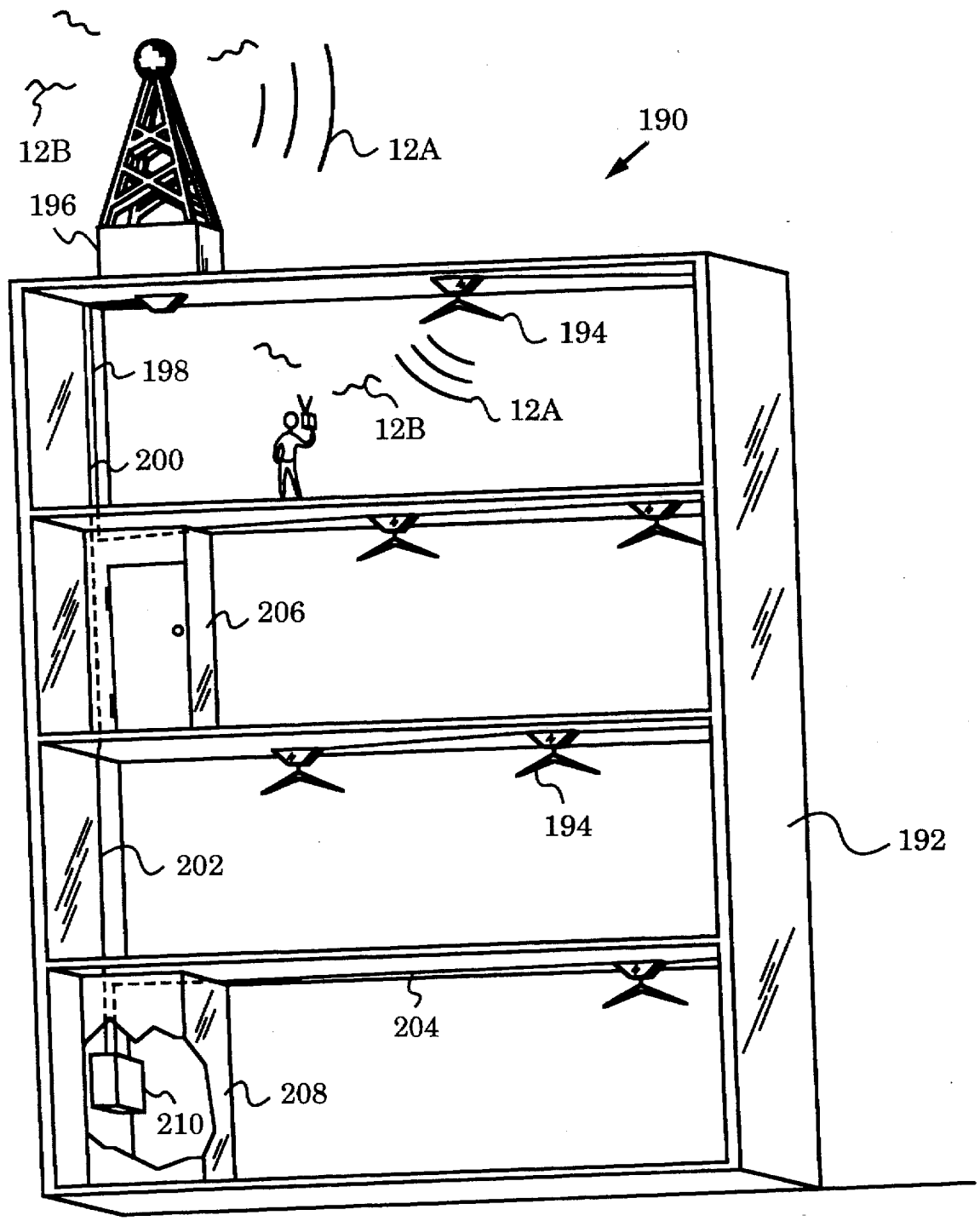
FIG. 9 is a three-dimensional view of the RF distribution system according to the invention adapted to a building structure.

FIG. 9 illustrates an RF distribution system 190 according to the invention used in a building structure 192. In this case system 190 is bi-directional, i.e., RF antennas 194 installed in various locations throughout structure 192 can re-transmit and receive RF signals 12. For better understanding, transmitted RF signals are designated by 12A and received RF signals are indicated by 12B. A main antenna 196 mounted on the roof of structure 192 can also transmit and receive RF signals 12A and 12B.

System 190 utilizes in-building low bandwidth network including cables 198, 200, 202, 204, and wiring closets 206 and 208 to distribute RF signal 12. In this particular arrangement, wiring closet 208 houses a distribution hub 210. The latter supplies global reference tone 102 from a temperature-stabilized crystal oscillator serving as the global reference oscillator (not shown). Protection of hub 210 from external influences is ensured by virtue of location of closet 208 on the ground floor and away from openings such as doors or windows.

It should be noted that cables 198, 200, 202, 204 may constitute a pre-existing network which can not be extensively modified by the designer without expensive re-routing work. For example, cables 198, 200, 202, 204 are standard AC power cables which are truly ubiquitous even in old structures. The choice of AC power cables will allow one to distribute RF signals in virtually any environment without altering the in-building cabling, thus providing an ultra-low-cost RF distribution network. An additional advantage of using AC power lines is that the power for operating antennas 194 and any other necessary electronics (not shown) can be provided through cables 198, 200, 202, and 204 simultaneously with the IF signal. Of course, since AC power lines are pre-installed, the designer of the RF distribution system will encounter some limitations. Indeed, in some rooms the locations of antennas 194 may be imposed by the infrastructure.

For example purposes, system 190 is assumed to be used for cordless telephony. Cordless telephones operate in the 900 MHz frequency band and has a narrow bandwidth which can be transmitted through cables 198, 200, 202, 204. Of course, in this application antennas 194 should be placed in locations outside building 192 as well (e.g., near a swimming pool, etc.).

Figure 10:
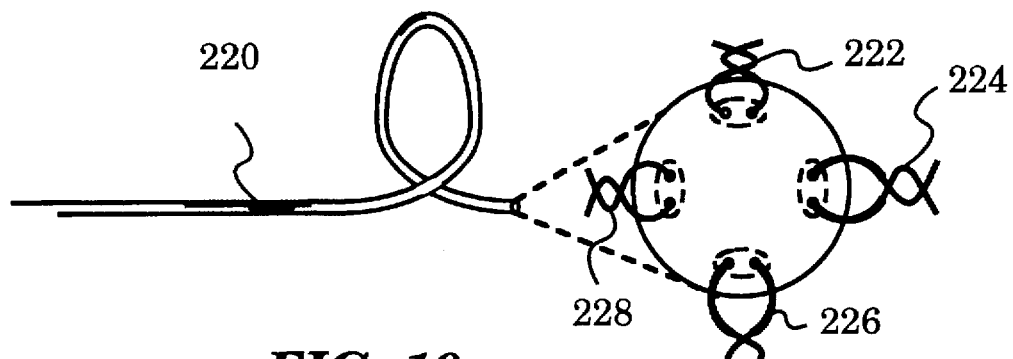
FIG. 10 is a diagram showing typical 10 Base T in-building cables.

FIG. 10 illustrates the most common low bandwidth medium 220 found inside buildings. In particular, medium 220 is a cable consisting of four twisted pairs 222, 224, 226, 228 or wire pairs. These can all be used for distributing signals for cellular communications, cordless telephony, local RF communications, satellite television, interactive multi-media video, or high bit-rate local area networks.

Figure 11:
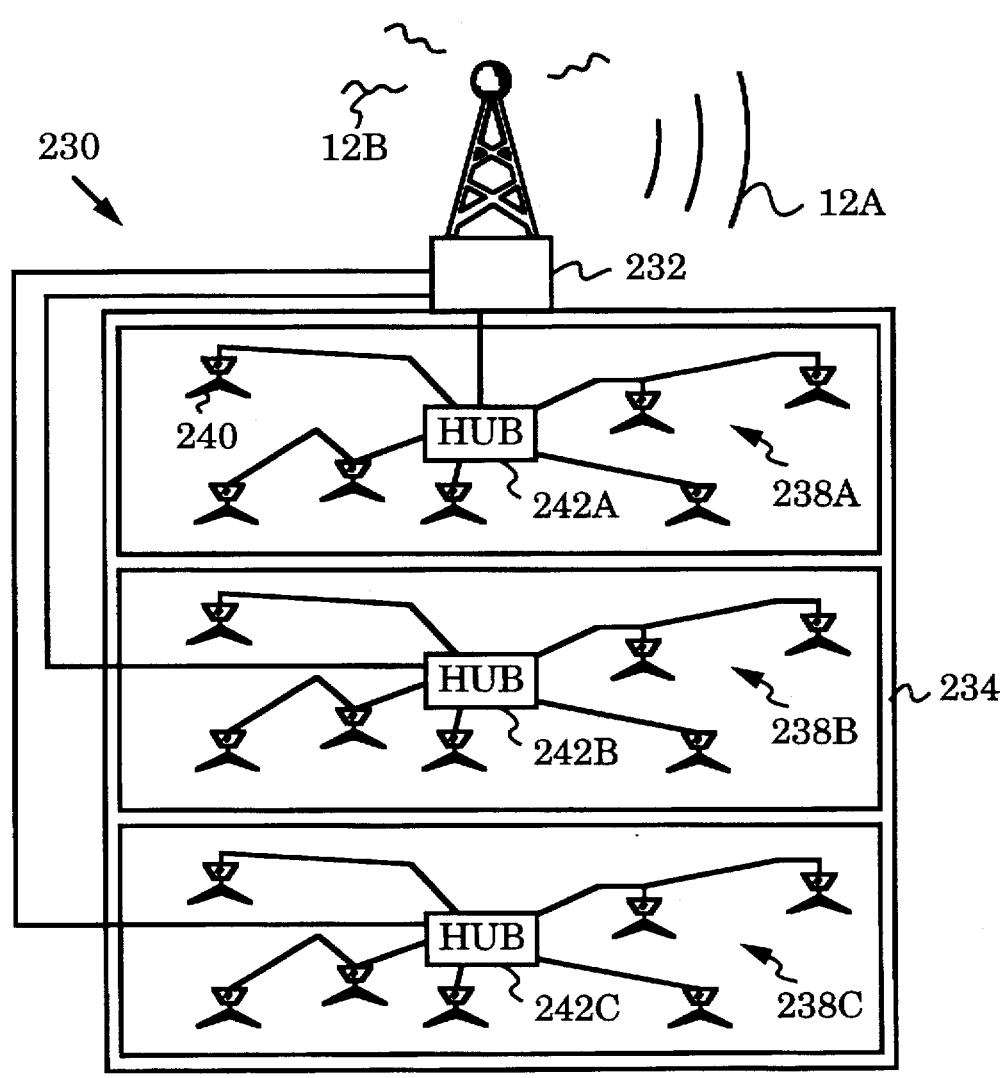
FIG. 11 is a schematic diagram of another RF distribution system according to the invention.

FIG. 11 illustrates schematically yet another RF distribution system 230 according to the invention. Main antenna 232 is positioned on top of a building 234 to receive and transmit RF signals 12A and 12B. System 230 consists of three star networks 238A, 238B, 238C, one per floor, individually fed from antenna 232. Networks 238A, 238B, 238C have RF antennas 240 and independent hubs 242A, 242B, 242C for housing the essential components discussed above.

Figure 12:
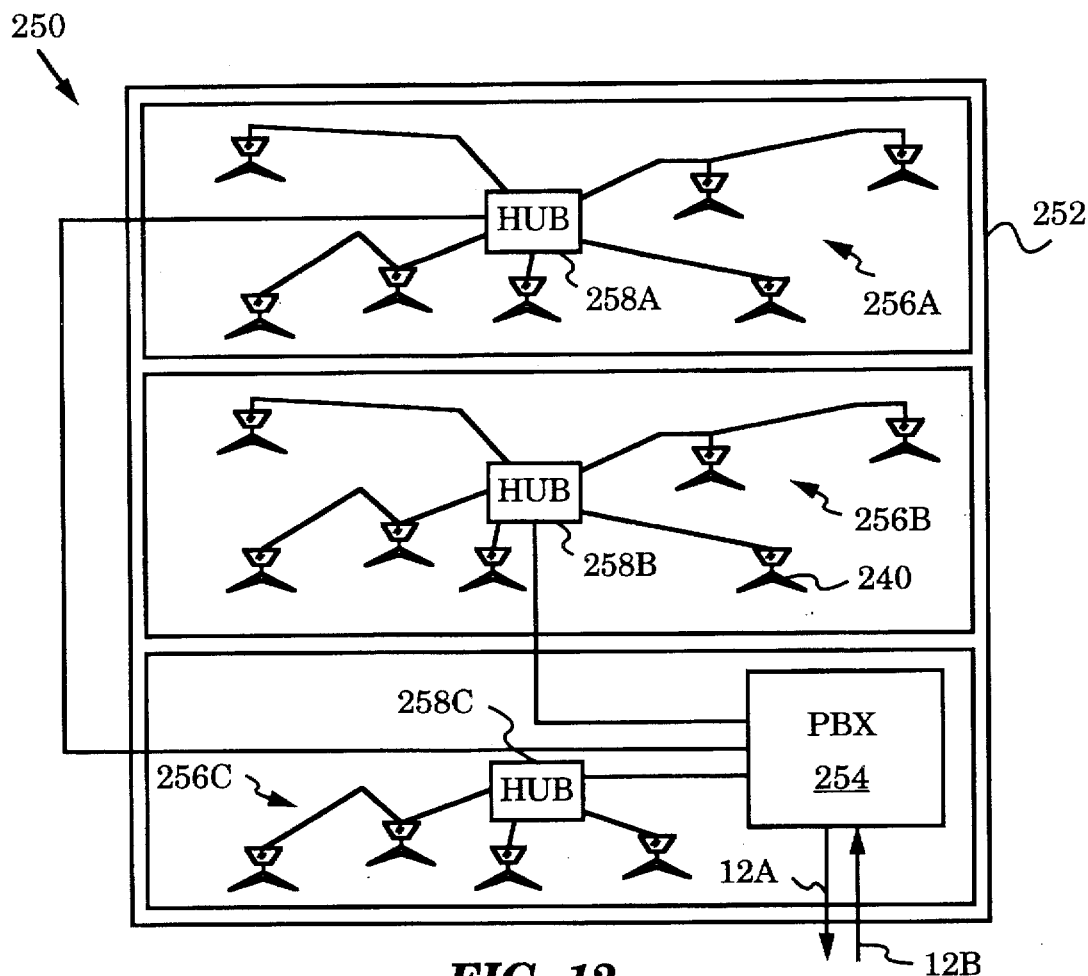
FIG. 12 is a schematic diagram of still another RF distribution system according to the invention.

FIG. 12 illustrates another advantageous RF distribution system 250 inside same building 252. System 250 takes advantage of a pre-installed private branch exchange 254 (PBX) and does away with a main antenna as the unit for receiving and re-transmitting RF signals 12A and 12B.

In this embodiment RF signals 12A and 12B are delivered to PBX 254 and received from it by any suitable high bandwidth medium (not shown). Thus, RF signals 12B are fed by PBX 254 to hubs 258A, 258B, 258C of three star networks 256A, 256B, 256C. Then, RF signals 12A are received from star networks 256A, 256B, 256C and sent back to PBX 254, which re-transmits them via the high bandwidth medium.

Since PBX systems are widespread, this embodiment is very practical. No additional cables need to be routed from any external RF antennas in this case. In fact, PBX systems are found in many locations and are frequently pre-wired for indoor within one or more building structures, and, in some cases, outdoor operation as well. Few modifications will be required to install an RF distribution system according to the invention in this manner.

Figure 13:
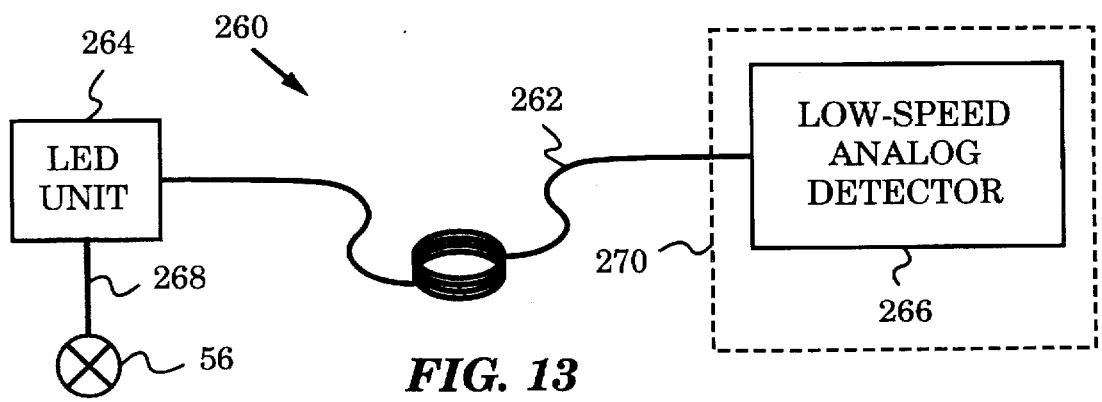
FIG. 13 is a diagram illustrating a portion of a system of the invention using multi-mode optical fiber.

FIG. 13 illustrates a portion of yet another system 260 according to the invention. A low bandwidth medium 262, in this case a multi-mode fiber optic cable, connects a LED (Light Emitting Diode) unit 264 to a low-speed analog detector 266 at a remote site 270. Because the transmission bandwidth of optic cable 262 required for this invention is below 100 MHz the length of cable 262 can exceed 1 km. The ability to cover such distances renders the embodiment particularly useful in shopping centers and other structures covering large areas.

Figure 4:
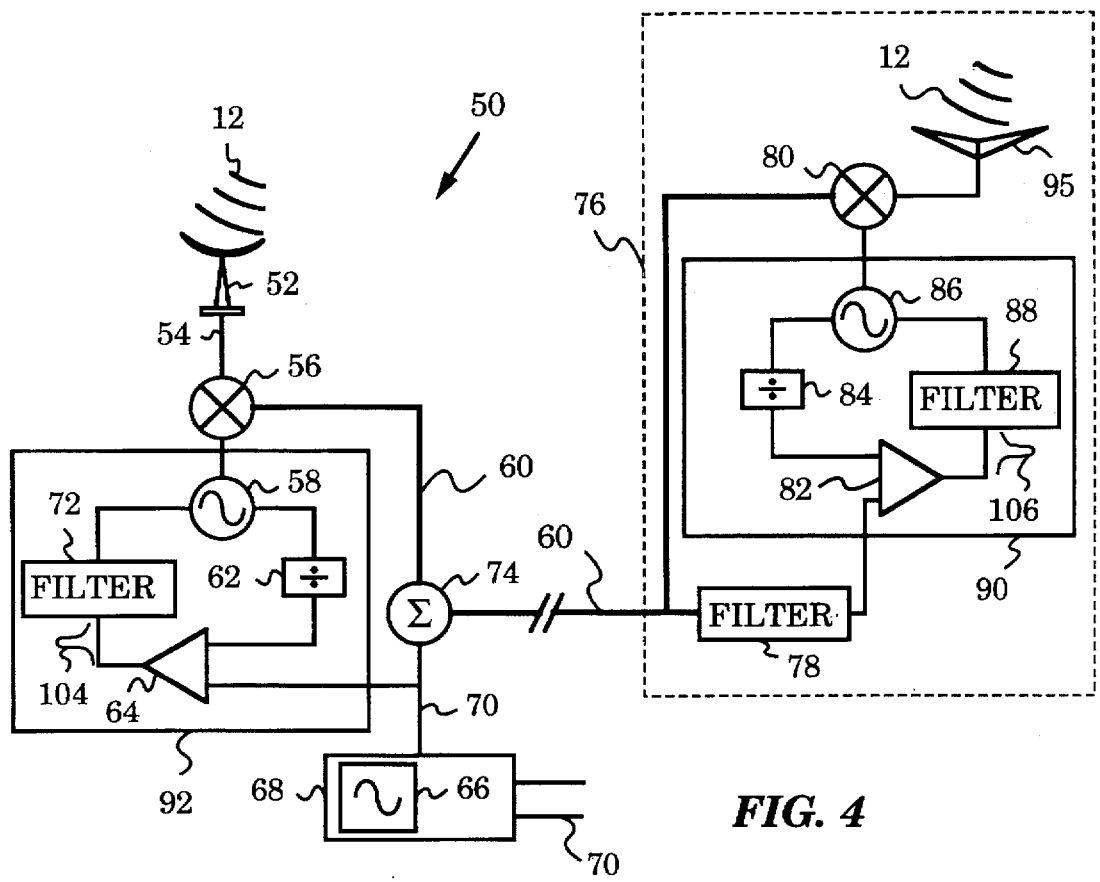
FIG. 4 is a schematic view of a simple RF distribution system according to the invention.

Same mixer 56 as in FIG. 4 delivers IF signal 94 to LED unit 264 via low bandwidth medium 268. Medium 268 may belong to a pre-installed network, e.g., AC power mains or telephone wires.

Figure 14:
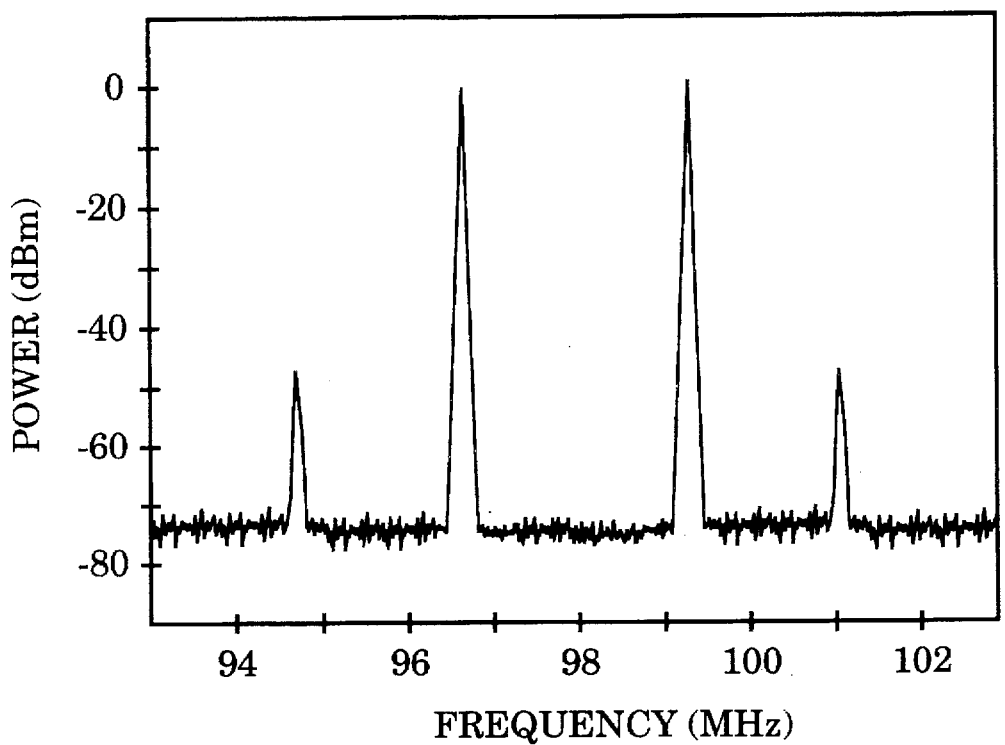
FIG. 14 is a graph of the Two Tone Test for the system of FIG. 13.

Low-cost LEDs exhibit an excellent response at low frequencies, in particular within the transmission bandwidth of medium 262, (<100 MHz), and no response at higher frequencies, e.g., 1 GHz. Thus, LED unit 264 is well-suited for feeding IF signal 94 through medium 262. Conventional optical systems use lasers and single-mode optical fibers, both of which are expensive, to send signals at various frequencies. This embodiment is very low cost in comparison with conventional systems and very efficient in the desired frequency range. In support of this fact, FIG. 14 shows the results of a standard Two Tone Test for LED unit 264 operating at 1.3 um and 1 km long cable 262.

Figure 15:
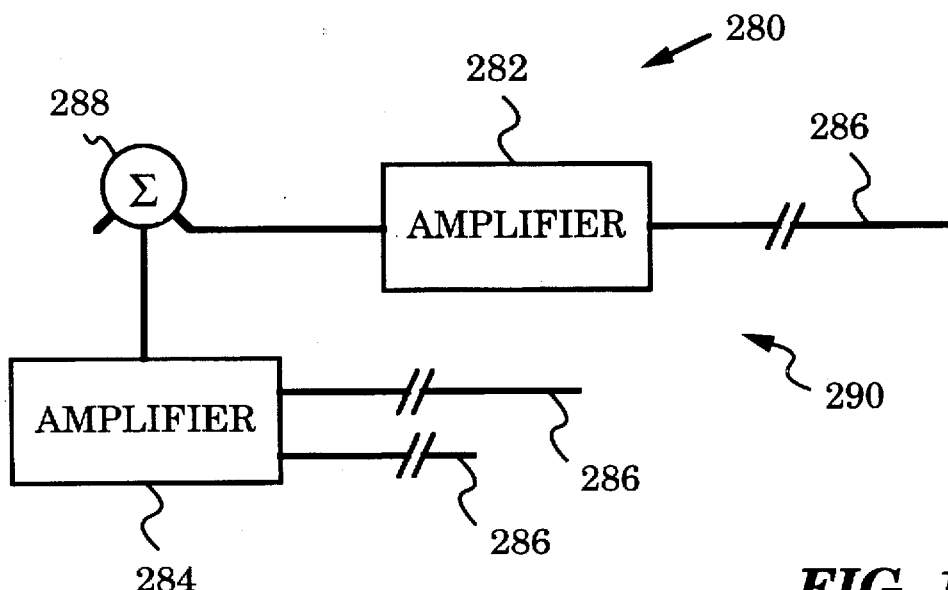
FIG. 15 is a diagram of an advantageous IF signal amplification method according to the invention.

Finally, FIG. 15 shows an advantageous addition to a portion of a system 280 according to the invention. System 280 uses a summing element 288 for adding global reference tone 102 to IF signal 94, as discussed above, and feeding both through a network 290 consisting of low bandwidth cables 286. Two standard amplifiers 282 and 284 for amplifying signals within transmission bandwidth 34 are connected to cables 286.

During operation amplifiers 282 and 284 amplify IF signal 94 while it passes through cables 286. If desired, both or one of amplifiers 282, 284 can also amplify global reference tone 102. A person skilled in the art will appreciate the fact that amplifying signals at lower frequencies is simpler and less costly than amplifying RF frequency signals. Thus, the present embodiment points out a particularly advantageous method for preserving the strength of signals distributed by a system according to the invention. This "repeater function" can be incorporated in any of the above embodiments by installing suitable low frequency amplifiers (<100 MHz) at frequencies corresponding to the IF signals and/or to the global reference tone.

The versatility of RF distribution systems according to the invention and its numerous embodiments teach a method of distributing RF signals. Indeed, a person skilled in the art will be able to glean from the examples given the characteristic features of the method of the invention.

SUMMARY, RAMIFICATIONS, AND SCOPE

The presented embodiments are only illustrative of some of the many types of networks which can be used according to the invention to distribute RF signals. Every particular network will be different, as conditioned by pre-existing infrastructure. Adaptations to particular bandwidths and frequencies, (e.g., for IF signals) will be made depending on application.

Therefore, the scope of the invention should be determined, not by examples given, but by the appended claims and their legal equivalents.

We claim:

1. A system for transmitting a RF signal contained in a RF bandwidth over a low bandwidth medium having a transmission bandwidth below said RF bandwidth, said system comprising:

a) a receiving means for receiving said RF signal;

b) a global reference oscillator for providing said system with a global reference tone of high stability at a frequency within said transmission bandwidth of said low bandwidth medium;

c) a first local oscillator controlled by a first adjustment signal derived from said global reference tone, such that said first local oscillator generates a first RF reference tone of high stability;

d) a first mixing means connected to said receiving means and to said first local oscillator for mixing said first RF reference tone with said RF signal to produce an IF signal within said transmission bandwidth, said first mixing means being further connected to said low bandwidth medium for feeding said IF signal through said low bandwidth medium;

e) a second local oscillator at a remote location from said first local oscillator, said second local oscillator being controlled by a second adjustment signal derived from said global reference tone, such that said second local oscillator generates a second RF reference tone of high stability at the same frequency as said first RF reference tone; and f) a second mixing means connected to said second local oscillator and to said low bandwidth medium for receiving and mixing said IF signal with said second RF reference tone to recover said RF signal.

2. The system of claim 1 further comprising a first phase-locking means switched before said first local oscillator for deriving said first adjustment signal from said global reference tone.

3. The system of claim 2 comprising a communication link for delivering said global reference tone from said global reference oscillator to said first phase-locking means.

4. The system of claim 2 further comprising a main hub for housing said first local oscillator, said first phase-locking means, and said global reference oscillator.

5. The system of claim 1 further comprising a second phase-locking means switched before said second local oscillator for deriving said second adjustment signal from said global reference tone.

6. The system of claim 5 further comprising a summing means connected to said low bandwidth medium and to said global reference oscillator for adding said global reference signal to said IF signal such that both said IF signal and said global reference signal are transmitted through said low bandwidth medium.

7. The system of claim 6 further comprising a filter positioned before said second phase-locking means to retrieve from said low bandwidth medium said global reference tone.

8. The system of claim 5 wherein said second local oscillator is a voltage-controlled oscillator and delivers an unstable RF reference tone, and said second phase-locking means comprises:

a) a frequency divider connected to said second local oscillator for dividing said unstable RF reference tone to derive an unstable IF reference tone at the frequency of said global reference tone;

b) a phase comparator for locking said unstable IF reference tone to said global reference tone, such that the output of said phase comparator delivers said second adjustment signal; and c) a filter for filtering and delivering said second adjustment signal to said second local oscillator, said second adjustment signal stabilizing said second local oscillator such that said second local oscillator generates said second RF reference tone of high stability.

9. The system of claim 1 wherein said first local oscillator is a voltage-controlled oscillator.

10. The system of claim 1 wherein said second local oscillator is a voltage-controlled oscillator.

11. The system of claim 1 further comprising a re-transmitting means for re-transmitting said RF signal recovered by said second mixing means.

12. The system of claim 11 wherein said re-transmitting means comprises a number of RF antennas, said RF antennas having corresponding remote coverage sites.

13. The system of claim 12 wherein said remote coverage sites overlap in radio coverage.

14. The system of claim 1 comprising a distribution hub for housing said global reference oscillator, such that said global reference signal is provided to said system from said distribution hub.

15. The system of claim 14, wherein said global reference oscillator is a temperature-stabilized crystal oscillator.

16. The system of claim 1, wherein said low bandwidth medium comprises a network.

17. The system of claim 16, wherein said network belongs to the group of networks consisting of star networks, ring networks, tree networks, and branch networks.

18. The system of claim 1 wherein said RF bandwidth is selected from the group of RF bandwidths used for cellular communications, cordless telephony, local RF communications, satellite television, interactive multimedia video, high bit-rate local area networks.

19. The system of claim 1 wherein said RF bandwidth is narrower that said transmission bandwidth of said low bandwidth medium.

20. The system of claim 19 wherein said low bandwidth medium is selected from the group consisting of 10 base T cable, telephone wire, fiber-optic cable, unshielded cable, and power cable.

21. A method for transmitting a RF signal contained in a RF bandwidth over a low bandwidth medium having a transmission bandwidth below said RF bandwidth, said method comprising the steps of:
   a) receiving said RF signal;
   b) providing a global reference tone of high stability at a frequency within said transmission bandwidth of said low bandwidth medium;
   c) generating a first RF reference tone of high stability by using a first adjustment signal derived from said global reference tone to control the output of a first local oscillator, such that said first local oscillator generates said first RF reference tone;
   d) mixing said first RF reference tone with said RF signal to produce an IF signal within said transmission bandwidth;
   e) feeding said IF signal through said low bandwidth medium;
   f) generating a second RF reference tone of high stability by using a second adjustment signal derived from said global reference tone to control the output of a second local oscillator, such that said second local oscillator generates said second RF reference tone; and
   g) mixing said second RF reference tone with said IF signal fed through said low bandwidth medium to recover said RF signal.

22. The method of claim 21 wherein said global reference tone does not overlap with the bandwidth of said IF signal.

23. The method of claim 21 wherein the frequency of said global reference tone is below the bandwidth of said IF signal.

24. The method of claim 23 wherein said RF signal is received at a remote coverage site and transmitted to a base station through said low bandwidth medium.

25. The method of claim 24 wherein said RF signal is re-transmitted at said base station.

26. The method of claim 23 wherein said RF signal is transmitted over said low bandwidth medium bi-directionally.

27. The method of claim 23 wherein said IF signal is amplified while passing through said low bandwidth medium.

28. The method of claim 23 wherein said global reference tone is amplified while passing through said low bandwidth medium.

29. The method of claim 21 wherein said RF signal is received at a base station and fed through said low bandwidth medium to a remote coverage site.

30. The method of claim 29 wherein said RF signal is re-transmitted at said remote coverage site.

* * * * *